(12) United States Patent
Ito et al.

(10) Patent No.: US 7,719,389 B2
(45) Date of Patent: May 18, 2010

(54) SYSTEM AND METHOD FOR CONTROLLING RESONANCE FREQUENCY OF FILM BULK ACOUSTIC RESONATOR DEVICES

(75) Inventors: Hiroyuki Ito, Hillsboro, OR (US); Hasnain Lakdawala, Beaverton, OR (US); Ashoke Ravi, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 237 days.

(21) Appl. No.: 11/836,538

(22) Filed: Aug. 9, 2007

(65) Prior Publication Data

US 2009/0039981 A1 Feb. 12, 2009

(51) Int. Cl.
*H03H 3/04* (2006.01)
*H03H 9/02* (2006.01)
(52) U.S. Cl. ...................................... 333/188; 333/187
(58) Field of Classification Search ................. 333/188, 333/187
See application file for complete search history.

(56) References Cited

U.S. PATENT DOCUMENTS 6,943,484 B2 * 9/2005 Clark et al. ................. 310/334
7,358,826 B2 * 4/2008 McCorquodale et al. .... 331/179
2004/0227578 A1 * 11/2004 Hamalainen ............ 331/107 A

OTHER PUBLICATIONS

Staszewski, Robert Bogdan, et al. Digitally Controlled Oscillator (DCO)-Based Architecture for RF Frequency Synthesis in a Deep-Submicrometer CMOS Process. IEEE Transactions on Circuits and Systems—II: Analog and Digital Signal Processing, vol. 50, No. 11, Nov. 2003. 14 pages.

* cited by examiner

*Primary Examiner*—Robert Pascal
*Assistant Examiner*—Alan Wong
(74) *Attorney, Agent, or Firm*—Grossman, Tucker, Perreault & Pfleger, PLLC

(57) ABSTRACT

Disclosed is a system and method for controlling a resonance frequency of a Film Bulk Acoustic Resonator (FBAR) device. The system includes at least one switching capacitor coupled to the FBAR device and a modulator. The at least one switching capacitor includes at least one capacitor and a switch configuration disposed in series with the FBAR device and the at least one capacitor, which is switch configuration capable of opening and closing connection of the at least one capacitor with the FBAR device. The modulator is coupled to the switch configuration, which generates a switching condition signal based on the manufacturing variation in the FBAR device and the environmental effects on the FBAR device. The switch configuration performs opening and closing of the connection of the at least one capacitor and the FBAR device based on the switching condition signal.

3 Claims, 2 Drawing Sheets

SYSTEM AND METHOD FOR CONTROLLING RESONANCE FREQUENCY OF FILM BULK ACOUSTIC RESONATOR DEVICES

FIELD OF THE DISCLOSURE

The present disclosure generally relates to film bulk acoustic resonator (FBAR) devices and, more particularly, to a system and method for controlling resonant frequencies of FBAR devices.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

The present disclosure provides a system and method for controlling a resonance frequency of a Film Bulk Acoustic Resonator (FBAR) device. The FBAR device may be used as a component of an oscillator, a tuner, a filter or the like. The present disclosure addresses a drift in the resonant frequency due to manufacturing variations in the FBAR device and environmental effects on the FBAR device. These manufacturing variations may include film deposition thicknesses in the FBAR device. The resonant frequency of the FBAR device depends upon the film deposition thickness. The environmental effects on the FBAR device may include a temperature change and/or a humidity level.

Figure 1:
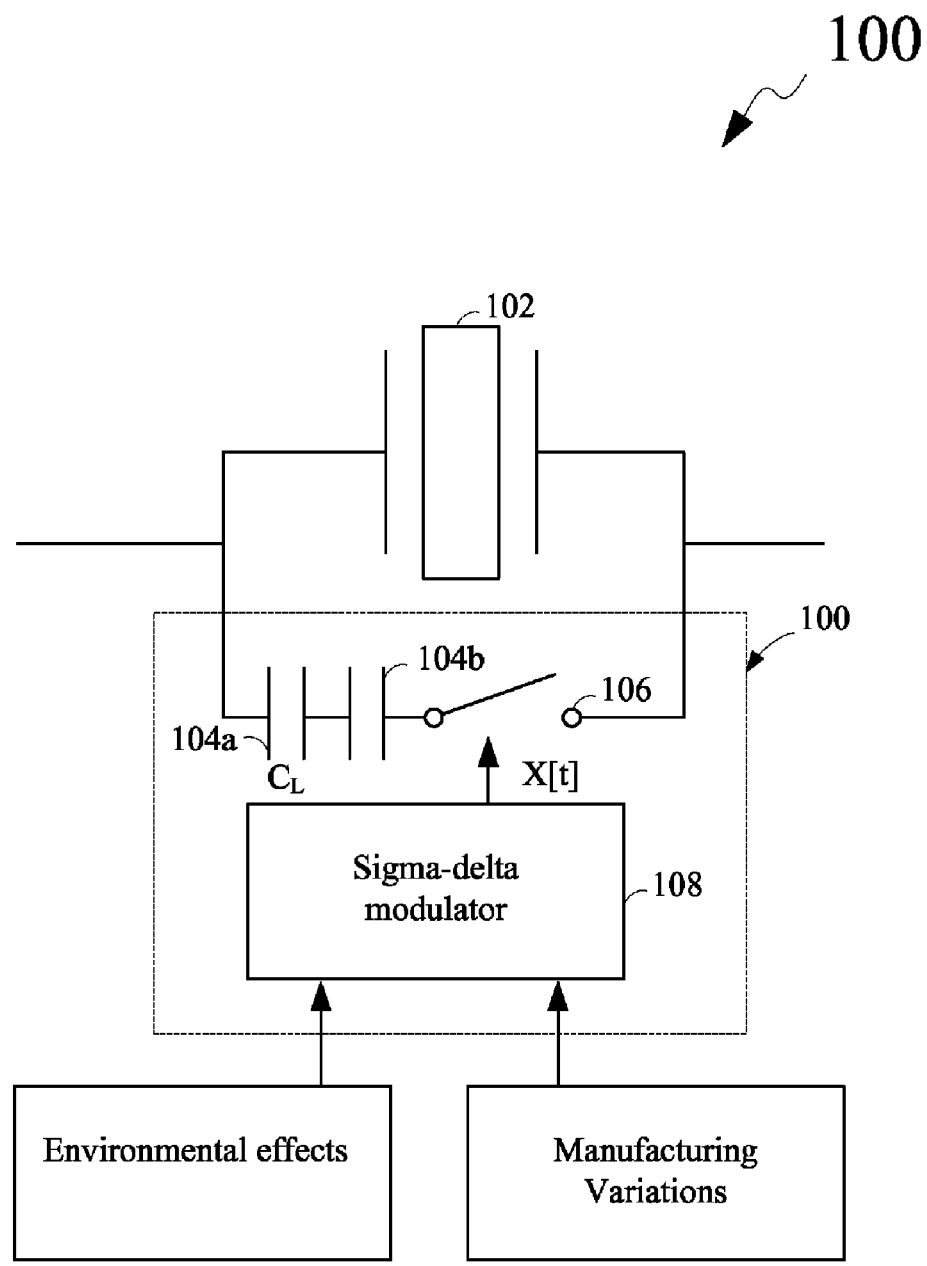
FIG. 1 is a schematic diagram illustrating a system for controlling a resonant frequency of a Film Bulk Acoustic Resonator (FBAR) device, according to an exemplary embodiment of the present disclosure.

FIG. 1 is a schematic diagram illustrating a system 100 for controlling a resonant frequency of a Film Bulk Acoustic Resonator (FBAR) device 102, according to an exemplary embodiment of the present disclosure. The system 100 comprises at least one switched capacitor which is capable of connecting and disconnecting with the FBAR device 102. The at least one switched capacitor comprises at least one capacitor, such as a capacitor 104a and a capacitor 104b, and a switch configuration 106. The capacitor 104a and 104b (hereinafter collectively referred to as 'capacitors 104' and shown as $C_L$ in FIG. 1) are coupled to the FBAR device 102. The capacitors 104 as shown in FIG. 1, is for the purposes of description only. However, in actual system 100, the number of capacitors may vary. The switch configuration 106 is disposed in series with the capacitors 104, and in parallel with the FBAR device 102. The switch configuration 106 is configured for connecting and disconnecting the capacitors 104 with the FBAR device 102 by opening and closing a switch.

The system 100 further comprises a modulator 108. In an embodiment of the present disclosure, the modulator 108 may be a sigma-delta modulator. The modulator 108 is operably coupled to the switch configuration 106. The modulator 108 is configured to generate a switching condition signal based on at least one of manufacturing variations in the FBAR device 102 and the environmental effects on the FBAR device 102. The switch configuration 106 opens and closes the switch to disconnect or connect the capacitors 104 to the FBAR device 102 based on the switching condition signal. Let the switching condition signal be represented as 'x[t]'. The average value of x[t] can be represented as $$x = \int_{t_1}^{t_2} \frac{x[t]}{t_2 - t_1},$$

where 'x' is the average value of x[t] with a fractional value between 0 and 1, and 't' represents time. A person skilled in the art will appreciate that the system 100, which has the sigma-delta modulator combined with the capacitors 104 that are switched with time, may be termed as a 'sigma-delta capacitive Digital-to-Analog Converter ('DAC').' The out of quantization band noise produced by this DAC may filtered due the sharp resonance characteristic of the FBAR device.

Figure 2:
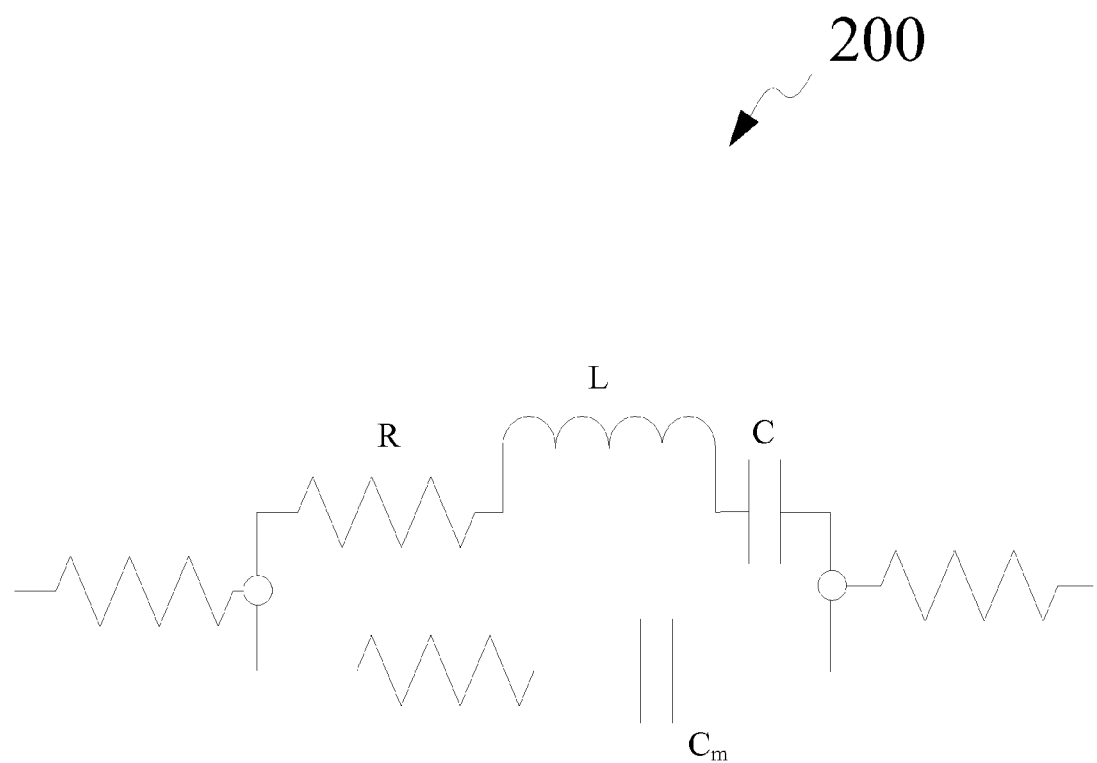
FIG. 2 is an equivalent circuit representation of the FBAR device accompanying the system of FIG. 1, according to another exemplary embodiment of the present disclosure.

Referring now to FIG. 2, represented is an equivalent circuit 200 of the FBAR device 102 accompanying the system 100 of FIG. 1, according to an exemplary embodiment of the present disclosure. The equivalent circuit 200 represents a model of the FBAR device 102, in general. The resonance frequency of the FBAR device 102 and the capacitors 104, which are switched based on the 'x[t]' in combination, may be represented as $$f_{res} = \frac{1}{2\pi\sqrt{LC}}\left(1 + \frac{C}{2(C_m + C_{mod})}\right),$$

where $f_{res}$ represents resonance frequency of the FBAR device 102 when used with the capacitors 104 switched with the x[t]; L represents inductance of the FBAR device 102, C and $C_m$ represent internal capacitances of the FBAR device 102 and $C_{mod}$ represents an accumulated effective capacitance of the capacitors 104, when the capacitors 104 are switched with the x[t]. The $C_{mod}$ may be equal to $x*C_L$ where $C_L$ is capacitance of the capacitors 104. It will be apparent to a person skilled in the art that the resonant frequency $f_{res}$ may be varied based on the value of $C_{mod}$, which is proportional to the x[t], whereas x[t] is set to compensate for at least one of the manufacturing variations in the FBAR device 102 and/or the environmental effects on the FBAR device 102.

Furthermore, resolution of controlling the drift in the $f_{res}$ may be increased by using multiple branches of capacitors and switches connected in parallel. Accordingly, the capacitors 104A/104B and switch 106 may be duplicated n number times in parallel branches to provide increased dynamic range. For example, let the modulator 108 be a 10-bit sigma-delta modulator with a multibit output. Each output bit drives a parallel branch consisting of capacitors and switches and each capacitor and switch bank is capable of changing the resonance frequency of 2 Hz. Thus, in this example, the use of 6 banks will allow the resolution of system 100 to be approximately equal to 6 Hz. Thus, the system 100 may change the resonance frequency of 12 kHz with 6 Hz resolution. The system 100 for controlling the resonance frequency of FBAR device 102 is described above by considering the FBAR device 102 as an FBAR oscillator. However, it will be apparent to a person skilled in the art that the above described system 100 may also be applied to other types of FBAR devices 102, such as controlling the center frequency of an FBAR used in a Front End Module (FEM) filter module. Of course, changing the value of capacitors using switches, as described herein, may be implemented using any combination of series and/or parallel capacitors and switches.

The controlling of the resonance frequency in an FBAR device may also be explained by the following method. The method addresses a drift in the resonant frequency due to manufacturing variations in the FBAR device and environmental effects on the FBAR device. The method comprises generating a switching condition signal based on at least one of manufacturing variations in the FBAR device and environmental effects on the FBAR device. The switching condition signal is generated by a sigma-delta modulator. The method further comprises modifying a circuit of the FBAR device by one of making and breaking a connection of at least one capacitive load in the circuit of the FBAR device. The making and breaking of the connection is performed based on the switching condition signal. By making and breaking the connection of the at least one capacitive load to the FBAR device, an equivalent circuit of the FBAR device may be modified. The resonant frequency of the FBAR device depends upon various capacitances (as discussed in conjunction with FIG. 2). It will be evident to a person skilled in the art that by making or breaking the connection of the at least one capacitive load to the FBAR device, various capacitances of the FBAR device may be modified, which in turn, may be used to control the resonant frequency of the FBAR device.

Various embodiments of the present disclosure provide following advantages. The use of the sigma-delta capacitive DAC as the system 100 covers both the wide tuning range and high resolution of controlling the resonance frequency with the use of small number of capacitors. Further, high resolution and the wide tuning range may be achieved by avoiding the use of small-sized capacitor, and using multiple capacitor and switch combinations in parallel. This reduces the manufacturing variations in an FBAR device. The technique can improve the frequency accuracy of a digitally controlled FBAR oscillator, which may be used as an alternative of a temperature-compensated crystal oscillator and is expected to reduce board size and manufacturing costs.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A system for controlling a resonance frequency of a Film Bulk Acoustic Resonator (FBAR) device, the system comprising:

at least one switched capacitor coupled to the FBAR device, the at least one switched capacitor capable of connecting with and disconnecting from the FBAR device; and a modulator operably coupled to the at least one switched capacitor, the modulator configured to generate a switching condition signal based on at least one of manufacturing variations of the FBAR device and environmental effects thereon;

wherein the at least one switched capacitor connects with and disconnects from the FBAR device based on the switching condition signal; and wherein the modulator is a sigma-delta modulator.

2. The system of claim 1, wherein the at least one switched capacitor comprises at least one capacitor; and a switch configuration for connecting and disconnecting the at least one capacitor with the FBAR device based on the switching condition signal, wherein the switch configuration is disposed in series with the at least one capacitor, and in parallel with the FBAR device.

3. A method for controlling a resonant frequency of a Film Bulk Acoustic Resonator (FBAR) device, the method comprising:

generating a switching condition signal based on at least one of manufacturing variations in the FBAR device and environmental effects thereon; and modifying a circuit of the FBAR device by one of making and breaking a connection of at least one capacitive load in the circuit of the FBAR device for controlling the resonant frequency of the FBAR device, wherein the making and breaking of the connection is performed based on the switching condition signal; and wherein the switching condition signal is generated by a sigma-delta modulator.

\* \* \* \* \*